United States Patent
Itou et al.

(10) Patent No.: US 8,378,704 B2
(45) Date of Patent: Feb. 19, 2013

(54) SUBSTRATE FOR A PROBE CARD ASSEMBLY

(75) Inventors: Seiichirou Itou, Kirishima (JP); Masashi Miyawaki, Kirishima (JP); Takeshi Oyamada, Kirishima (JP)

(73) Assignee: Kyocera Corporation, Kyoto (JP)

( * ) Notice: Subject to any disclaimer, the term of this patent is extended or adjusted under 35 U.S.C. 154(b) by 1025 days.

(21) Appl. No.: 11/943,105

(22) Filed: Nov. 20, 2007

(65) Prior Publication Data

US 2008/0180118 A1 Jul. 31, 2008

(30) Foreign Application Priority Data

Jan. 30, 2007 (JP) ................. 2007-018932
Feb. 27, 2007 (JP) ................. 2007-047346
Aug. 30, 2007 (JP) ................. 2007-223470

(51) Int. Cl.
*G01R 31/00* (2006.01)
(52) U.S. Cl. ............. 324/756.03; 324/754.07; 174/255; 174/256
(58) Field of Classification Search ............. 324/755.04, 324/754.18, 750.04, 750.28
See application file for complete search history.

(56) References Cited

U.S. PATENT DOCUMENTS

| | | | |
|---|---|---|---|
| 6,270,363 B1 * | 8/2001 | Brofman et al. | 439/91 |
| 6,399,891 B1 * | 6/2002 | Kurita et al. | 174/256 |
| 6,729,019 B2 * | 5/2004 | Grube et al. | 29/830 |
| 6,828,510 B1 * | 12/2004 | Asai et al. | 174/255 |
| 7,088,118 B2 * | 8/2006 | Liu et al. | 324/756.03 |
| 7,368,927 B2 * | 5/2008 | Smith et al. | 324/754.07 |
| 2004/0150118 A1 * | 8/2004 | Honda | 257/778 |
| 2004/0170846 A1 * | 9/2004 | Seita et al. | 428/457 |
| 2004/0173891 A1 * | 9/2004 | Imai et al. | 257/686 |
| 2005/0287721 A1 * | 12/2005 | Yamamoto et al. | 438/149 |
| 2006/0060959 A1 * | 3/2006 | Hayashi et al. | 257/697 |
| 2006/0094004 A1 * | 5/2006 | Nakajima et al. | 435/5 |
| 2007/0080454 A1 * | 4/2007 | Hamaguchi | 257/737 |
| 2007/0259541 A1 * | 11/2007 | Myers et al. | 439/70 |

\* cited by examiner

*Primary Examiner* — Richard Isla Rodas
(74) *Attorney, Agent, or Firm* — Ditthavong Mori & Steiner, P.C.

(57) ABSTRACT

A substrate is provided for a probe card assembly. The substrate includes an interconnection layer including a first surface having a first electrode set and a second surface having a second electrode set electrically connected to the first electrode set. The substrate further includes a base layer including a first surface having a third electrode set electrically connected to the second electrode set and a second surface having a plurality of contact terminals electrically connected to the third electrode set. And the substrate further includes a resin layer including a plurality of sublayers made of different materials. The resin layer is attached to the first surface of the base layer and the second surface of the interconnection layer.

14 Claims, 12 Drawing Sheets

FIG. 12
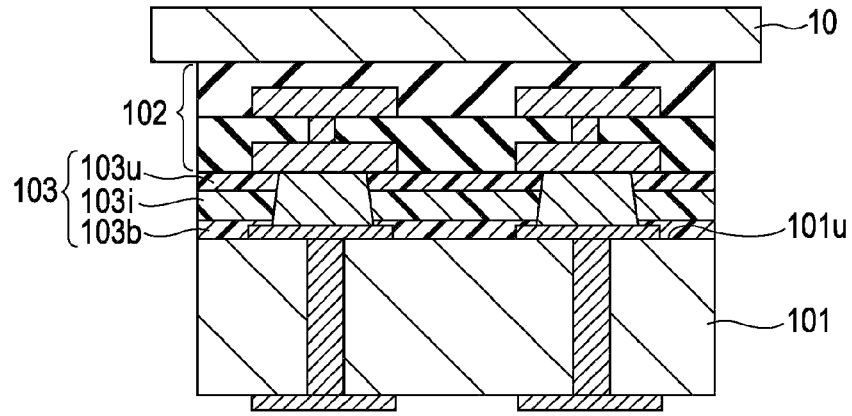
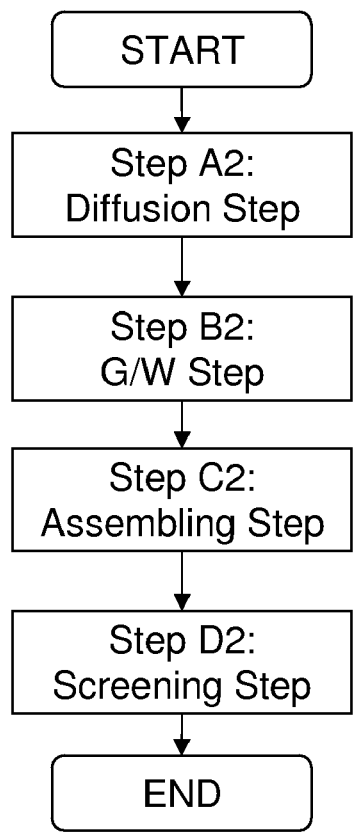
FIG. 13

SUBSTRATE FOR A PROBE CARD ASSEMBLY

BACKGROUND OF THE INVENTION

1. Field of the Invention

The present invention relates to a probe card assembly used for the inspection of a semiconductor wafer and a method of inspecting a semiconductor wafer.

2. Description of the Related Art

Semiconductor devices such as memory, are produced by separating a semiconductor wafer having a plurality of layers including conductive patterns into pieces. Processes of producing semiconductor devices include a step of inspecting characteristics of an integrated circuit formed on a surface of a semiconductor wafer. The inspection is performed by electrically connecting the semiconductor wafer to a probe card.

A probe card assembly used for the inspection includes a substrate, such as a space transformer substrate, used for electrically connecting the probe card to the semiconductor wafer. This substrate results in electrical connection between integrated circuits on the semiconductor wafer and terminals of test equipment.

SUMMARY OF THE INVENTION

According to an aspect of the present invention, a method of manufacturing a substrate includes preparing a interconnection layer, a resin layer, and a base layer. The interconnection layer includes a first surface having a first electrode set and a second surface having a second electrode set electrically connected to the first electrode set. The base layer includes a first surface having a third electrode set and a second surface having a plurality of contact terminals electrically connected to the third electrode set. The method of manufacturing a substrate further includes attaching the resin layer to the second surface of the interconnection layer by a first thermal process at a first temperature. The method of manufacturing a substrate further includes attaching the resin layer attached to the interconnection layer to the first surface of the base layer by a second thermal process at a second temperature higher than the first temperature.

According to another aspect of the present invention, a substrate includes a interconnection layer, a base layer, and a resin layer. The interconnection layer includes a first surface having a first electrode set and a second surface having a second electrode set electrically connected to the first electrode set. The base layer includes a first surface having a third electrode set electrically connected to the second electrode set and a second surface having a plurality of contact terminals electrically connected to the third electrode set. The resin layer includes a plurality of sublayers made of different materials. The resin layer is attached to the first surface of the base layer and the second surface of the interconnection layer.

According to another aspect of the present invention, a method of inspecting a semiconductor wafer includes placing the semiconductor wafer on a stage. The method includes electrically connecting a tester to a probe card assembly including a substrate having a interconnection layer attached to a base layer with a resin layer including a plurality of sublayers made of different materials. The method includes bringing probes of the probe card assembly into electrical contact with electrodes of the semiconductor wafer.

BRIEF DESCRIPTION OF THE DRAWINGS

FIGS. 11A, 11B, and 12 are cross-sectional views illustrating step F; and

FIG. 13 illustrates a method of manufacturing a semiconductor device.

DESCRIPTION OF THE PREFERRED EMBODIMENTS

Figure 1:
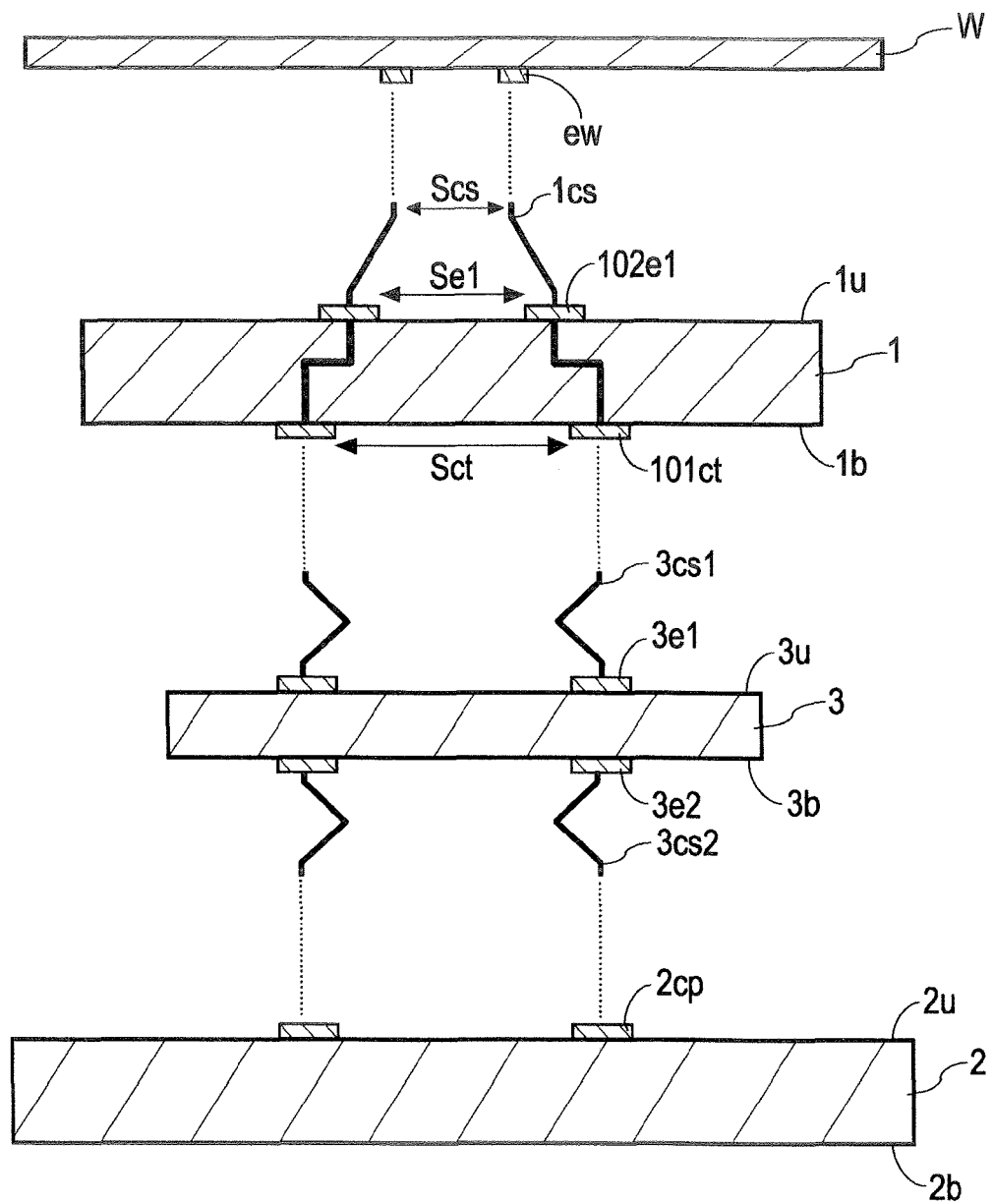
FIG. 1 is a cross-sectional view of a probe card assembly according to an embodiment.

A probe card assembly of the present embodiment will be described below with reference to the attached drawings. As illustrated in FIG. 1, the probe card assembly includes a substrate 1 for the probe card assembly (hereinafter, referred to as a "substrate 1"), a probe card 2, and an interposer substrate 3. The substrate 1 is brought into contact with a plurality of electrodes ew disposed on a first surface (a bottom surface in FIG. 1) of a semiconductor wafer w. The interposer substrate 3 is disposed between the substrate 1 and the probe card 2.

The substrate 1 has a first surface $1u$ (a upper surface in FIG. 1) facing the semiconductor wafer w and a second surface $1b$ (a bottom surface in FIG. 1) facing the interposer substrate 3. The substrate 1 includes first electrode sets $102e1$ disposed on the first surface $1u$ and a plurality of contact terminals $101ct$ disposed on the second surface $1b$. The space Se1 between the first electrode sets $102e1$ is different from the space Sct between the plurality of contact terminals $101ct$. The space Se1 is smaller than the space Sct. The substrate 1 further includes a plurality of contact structures $1cs$ electrically connected to the first electrode sets $102e1$. The space Scs between the contact structures $1cs$ corresponds to the space between the electrodes ew of the semiconductor wafer w. The space Sct corresponds to the space between a plurality of contact pads $2cp$ disposed on an upper surface $2u$ of the probe card 2. The substrate 1 is a space-transformer that transforms the space between conductive patterns.

The probe card 2 includes the first surface $2u$ (an upper surface in FIG. 1) facing the interposer substrate 3 and a second surface $2b$ (a bottom surface in FIG. 1). The probe card 2 includes the plurality of contact pads $2cp$ disposed on the upper surface $2u$. The interposer substrate 3 electrically connects the substrate 1 to the probe card 2. The interposer substrate 3 includes a first surface $3u$ (an upper surface in FIG. 1) facing the substrate 1 and a second surface $3b$ (a bottom surface in FIG. 1) facing the probe card 2. The interposer substrate 3 includes a plurality of electrodes 3e1 disposed on the first surface 3u and a plurality of electrodes 3e2 disposed on the second surface 3b.

Figure 2:
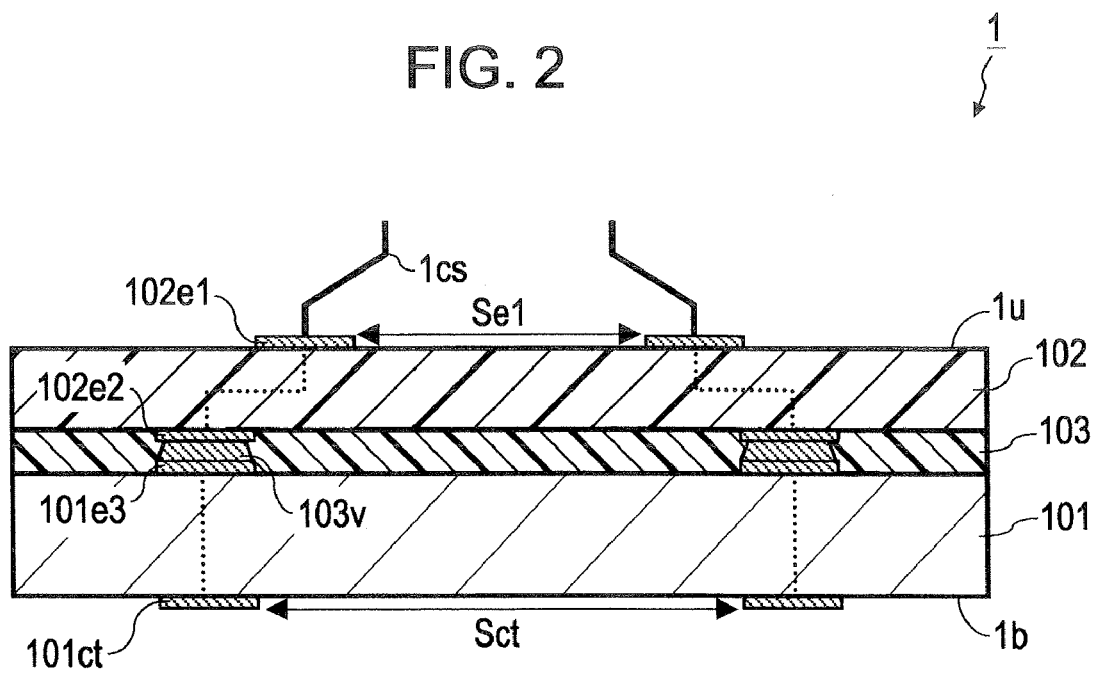
FIG. 2 is a cross-sectional view of a substrate for a probe card assembly according to the embodiment.
Figure 3:
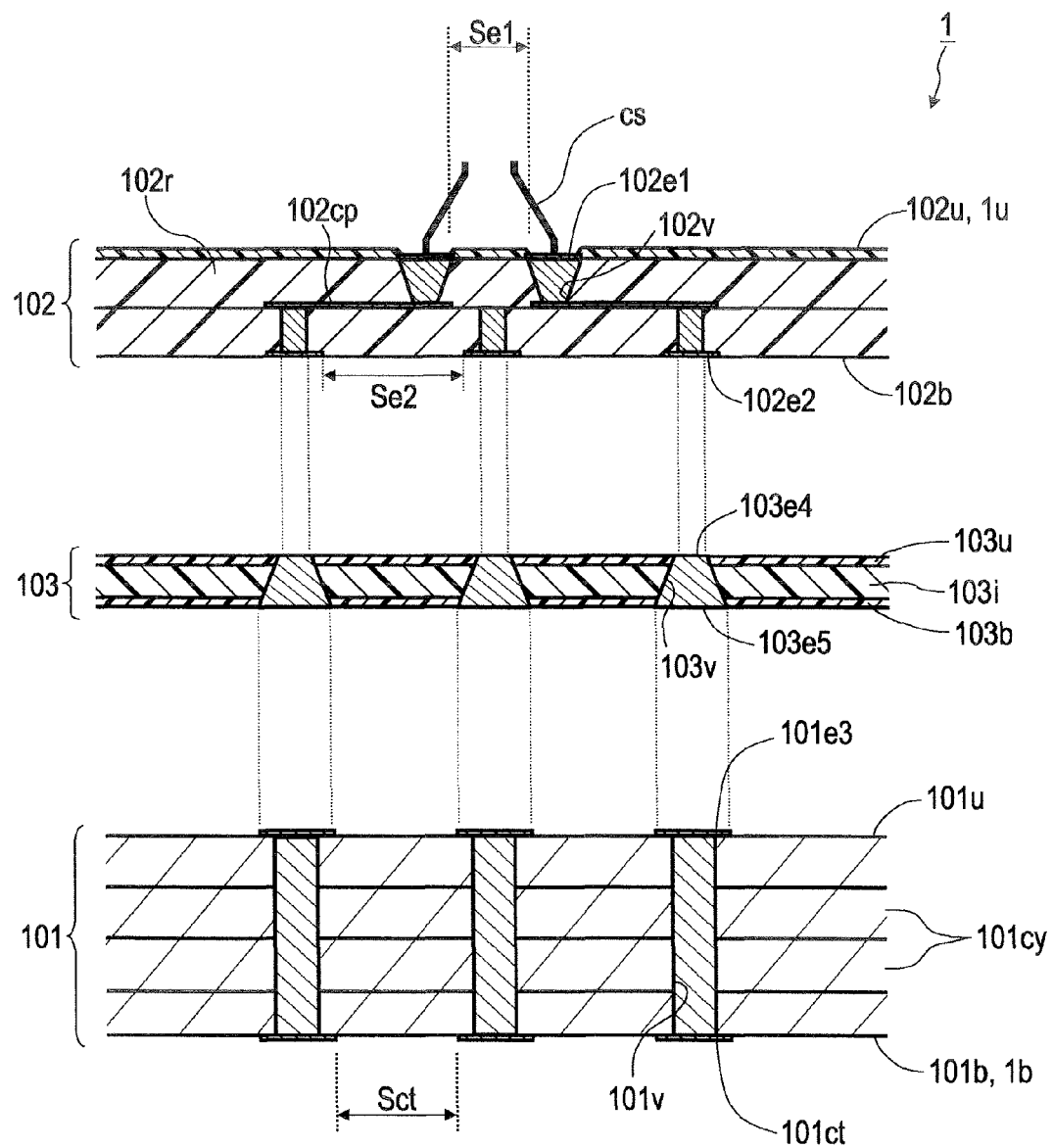
FIG. 3 is an exploded cross-sectional view of the substrate illustrated in FIG. 2.

As illustrated in FIGS. 2 and 3, the substrate 1 includes a base layer 101, an interconnection layer 102, and a resin layer 103. The base layer 101 includes a first surface 101u (an upper surface in FIG. 3) attached to the interconnection layer 102 and a second surface 101b (a bottom surface in FIG. 3) facing the interposer substrate 3. The plurality of contact terminals 101ct are disposed on a bottom surface 101b of the base layer 101 and are in contact with a plurality of contact structures 3cs1 of the interposer substrate 3. Third electrode sets 101e3 are disposed on the first surface 101u of the base layer 101. The contact terminals 101ct are electrically connected to the third electrode sets 101e3 through a plurality of via conductors 101v. The base layer 101 includes a plurality of ceramic sublayers 101cy stacked.

The interconnection layer 102 includes a first surface 102u (an upper surface in FIG. 3) facing the semiconductor wafer w and a second surface 102b (a bottom surface in FIG. 3) attached to the resin layer 103. The interconnection layer 102 includes the first electrode sets 102e1 disposed on the upper surface 102u and second electrode sets 102e2 disposed on the bottom surface 102b. The second electrode sets 102e2 are electrically connected to the third electrode sets 101e3 of the base layer 101. The first electrode sets 102e1 are electrically connected to the second electrode sets 102e2 with a plurality of via conductors 102v and a plurality of conductive patterns 102cp. The space (indicated by reference numeral Se1 in FIGS. 2 and 3) between the first electrode sets 102e1 is different from the space (indicated by reference numeral Sct in FIGS. 2 and 3) between the contact terminals 101ct disposed on the bottom surface 101b of the base layer 101. The space Se1 between the first electrode sets 102e1 is smaller than the space Sct of the contact terminals 101ct. The space Se1 of the first electrode sets 102e1 is different from the space (indicated by reference numeral Se2 in FIG. 3) between the second electrode sets 102e2. The space Se1 between the electrodes of the first electrode sets 102e1 is smaller than the space between the second electrode sets 102e2.

The resin layer 103 is attached to the first surface 101u of the base layer 101 and the second surface 102b of the interconnection layer 102. The resin layer 103 includes fourth electrode sets 103e4 disposed on the upper surface thereof and fifth electrode sets 103e5 disposed on the bottom surface thereof. The resin layer 103 includes a plurality of via conductors 103v electrically connected to the third electrode sets 101e3 of the base layer 101. The diameter of each of the via conductors 103v increases at positions closer to the base layer 101. The resin layer 103 includes a plurality of sublayers made of different materials. The resin layer 103 includes a first sublayer 103u, a second sublayer 103b, and a third sublayer 103i. The first sublayer 103u is made of a first thermosetting resin material. The resin material of the first sublayer 103u is selected from the group consisting of polyamide imide resins, polyimide siloxane resins, bismaleimide resins, and epoxy resins. The second sublayer 103b is made of a second thermosetting resin material. The resin material of the second sublayer 103b is selected from the group consisting of polyimide resins, polyquinoline resins, polyamide imide resins, epoxy resins, and fluorocarbon resins. The third sublayer 103i is made of a third thermoplastic resin material. The resin material of the third sublayer 103i is selected from the group consisting of glass epoxy resins, polyether ether ketone (PEEK) resins, and polyimide resins.

Examples of a combination of the resin materials used for the sublayers include the following three combinations.

EXAMPLE 1

First sublayer 103u: polyamide imide resin
Second sublayer 103b: polyimide resin
Third sublayer 103i: polyether ether ketone (PEEK) resin

EXAMPLE 2

First sublayer 103u: polyamide imide resin
Second sublayer 103b: epoxy resin
Third sublayer 103i: glass epoxy resin

EXAMPLE 3

First sublayer 103u: polyimide siloxane resin
Second sublayer 103b: fluorocarbon resin
Third sublayer 103i: polyimide resin The combination of Example 1 results in the substrate 1 having improved heat resistance. The combination of Example 2 results in the substrate 1 having improved chemical resistance. The combination of Example 3 results in the substrate 1 having improved electrical characteristics.

Figure 4:
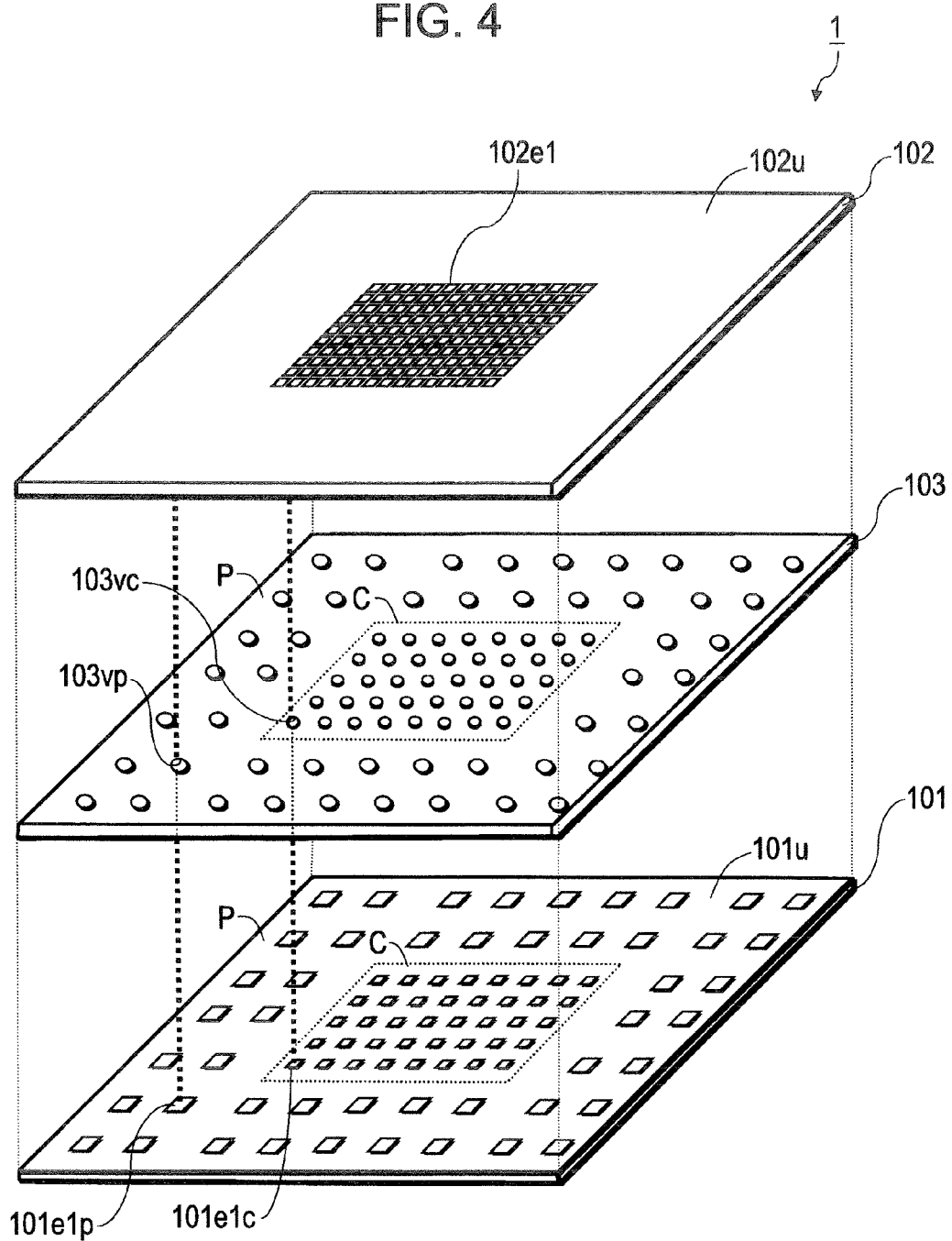
FIG. 4 is an exploded perspective view of the substrate illustrated in FIG. 2.
Figure 5A:
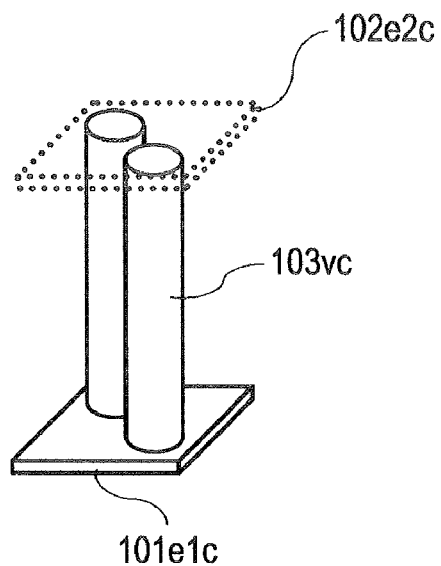
FIGS. 5A and 5B are perspective views of via conductors in a resin layer.
Figure 5B:
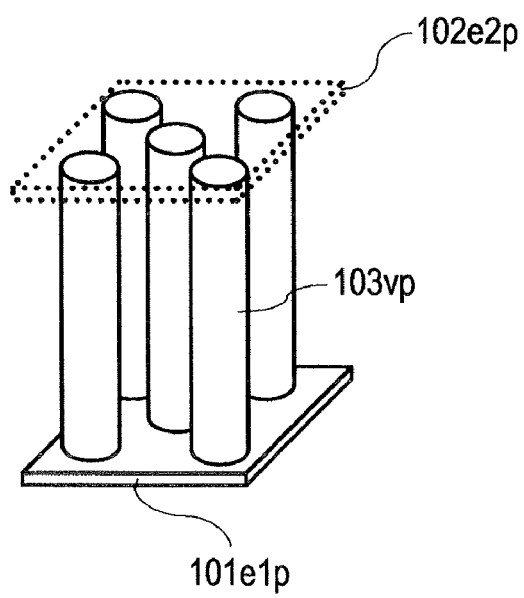

The via conductors 103v of the resin layer 103 will be described below with reference to FIGS. 4, 5A, and 5B. As illustrated in FIG. 4, each of areas of electrodes 101e1p in a peripheral region of the first surface 101u of the base layer 101 is larger than that of each electrode 101e1c in a central region. As illustrated in FIGS. 5A and 5B, the number of via conductors 103vp connected per electrode 101e1p is larger than that of via conductors 103vc connected per electrode 101e1c. Two via conductors 103vc are connected to each electrode 101e1c. Five via conductors 103vp are connected to each electrode 101e1p. The substrate 1 according to this embodiment has the above-described structure, thereby reducing overall deformation while design freedom is maintained.

Figure 6:
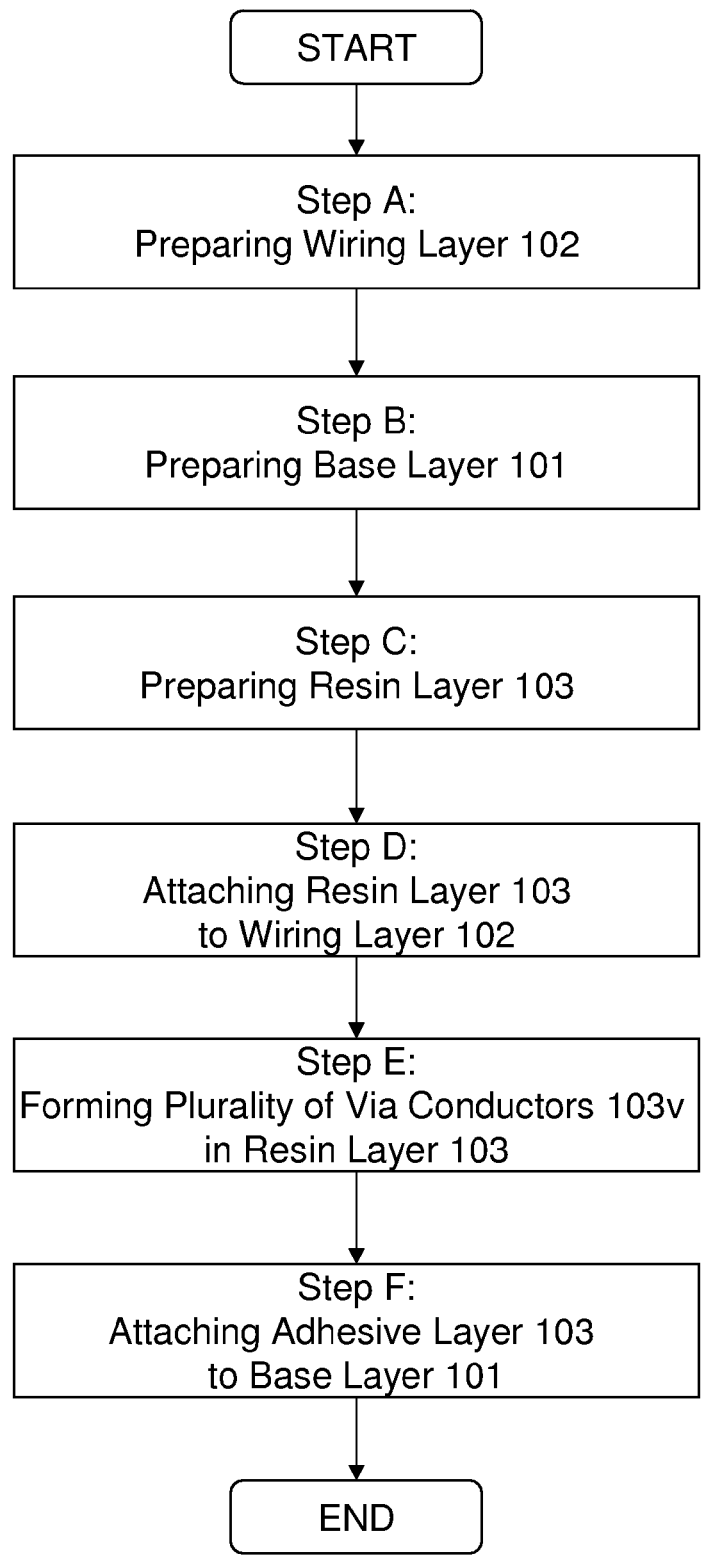
FIG. 6 illustrates a method of manufacturing a substrate for a probe card assembly of the embodiment.

As illustrated in FIG. 6, a method of manufacturing a probe card assembly includes Steps A to F described below, Steps A to F corresponding to FIGS. 7A to 7F:

A: preparing the interconnection layer 102,
B: preparing the base layer 101,
C: preparing the resin layer 103,
D: attaching the resin layer 103 to the interconnection layer 102,
E: forming the plurality of via conductors 103v in resin layer 103, and
F: attaching the resin layer 103 attached to the interconnection layer 102 to the base layer 101.

Figure 7A:
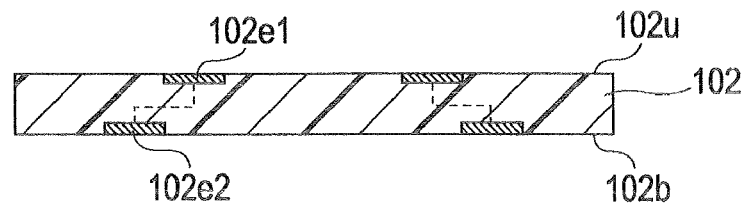
FIG. 7A is a cross-sectional view of a interconnection layer prepared in step A.
Figure 8A:
FIGS. 8A to 8D are cross-sectional views illustrating step A.
Figure 8B:
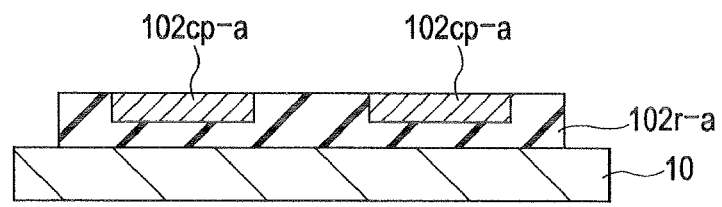
Figure 8C:
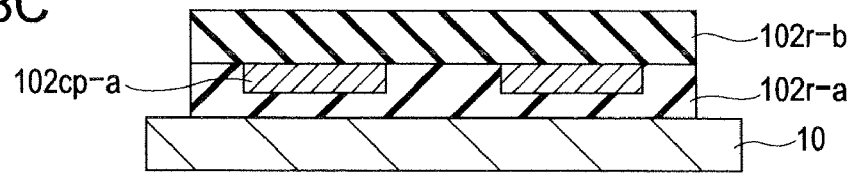
Figure 8D:
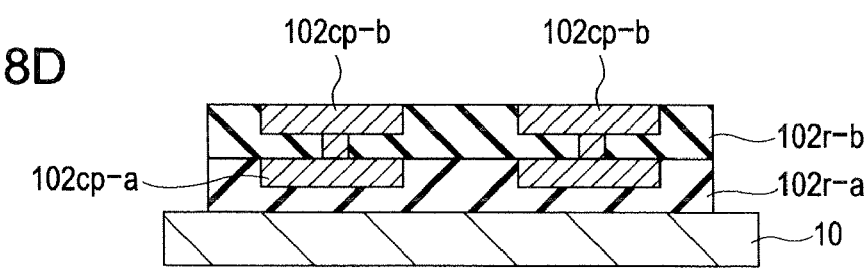

Step A will be described below. As illustrated in FIG. 8A, an insulating layer 102r-a is fixed to a flat plate 10. The plate 10 is made of glass, a ceramic material, or silicon. The insulating layer 102r-a is made of a resin material such as polyimide. An example of a method of fixing the insulating layer 102r-a to the plate 10 involves attaching the insulating layer 102r-a to the plate 10 with an adhesive. In this method, the amount of heat applied to the insulating layer 102r-a is low, thus reducing the amount of expansion. Alternatively, a method of irradiating the insulating layer 102r-a with laser light may be employed. In this method, the processing time is short, thus reducing degradation of the insulating layer 102r-a. The method using laser light reduces the influence of an unnecessary gas on the insulating layer 102r-a as compared with the method using the adhesive. As illustrated in FIG. 8B, conductive patterns 102cp-a are formed on the insulating layer 102*r-a* after the step illustrated in FIG. 8A. The phrase "on the insulating layer 102*r-a*" includes a structure in which the conductive patterns 102*cp-a* are embedded in the insulating layer 102*r-a*, as illustrated in FIG. 8B. Each of the conductive patterns 102*cp-a* is made of Cu, Al, or Ag. As illustrated in FIG. 8C, an insulating layer 102*r-b* is formed on the conductive patterns 102*cp-a* after the step illustrated in FIG. 8B. The insulating layer 102*r-h* is made of the same material as that of the insulating layer 102*r-a*. As illustrated in FIG. 8D, conductive patterns 102*cp-b* are formed on the insulating layer 102*r-b* after the step illustrated in FIG. 8C. After the step illustrated in FIG. 8D, the lamination of an insulating layer and conductive patterns is repeated. As illustrated in FIG. 7A, the interconnection layer 102 prepared in Step A includes the first surface 102*u* having the first electrode sets 102*e*1 and the second surface 102*b* having the second electrode sets 102*e*2. Each of the first electrode sets 102*e*1 is electrically connected to the second electrode sets 102*e*2.

In the method according to this embodiment, the insulating layers and the conductive patterns are stacked on the flat plate 10 to form the interconnection layer 102 having filled via. Specifically, the conductive layer is formed by CMP (chemical mechanical polishing) to form the interconnection layer 102 having filled via. A substrate for a probe card assembly obtained by the method according to this embodiment has improved reliability for multiple contacts during inspections of semiconductor wafers.

Figure 7B:
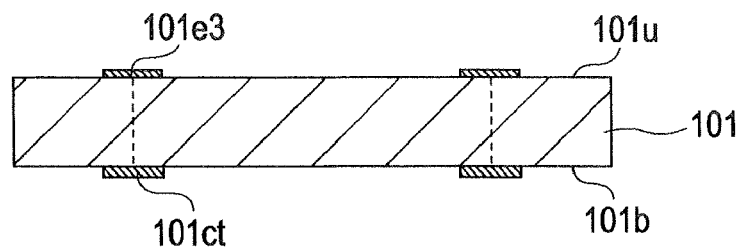
FIG. 7B is a cross-sectional view of a base layer prepared in step B.

As illustrated in FIG. 7B, the base layer 101 prepared in Step B includes the first surface 101*u* having the third electrode sets 101*e*3 and the second surface 101*b* having the plurality of contact terminals 101*ct*. The third electrode sets 101*e*3 are electrically connected to the contact terminals 101*ct*.

Figure 7C:
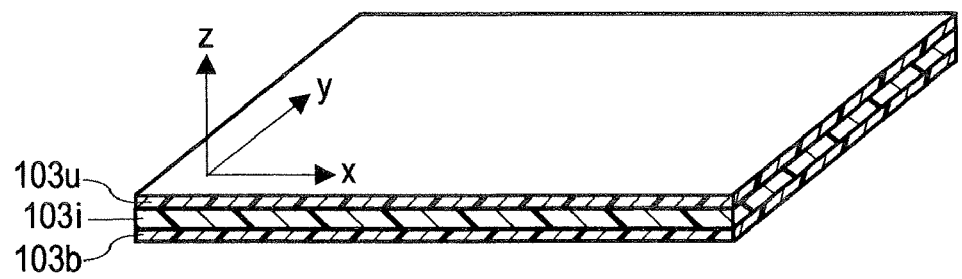
FIG. 7C is a cross-sectional view of a resin layer prepared in step C.
Figure 7D:
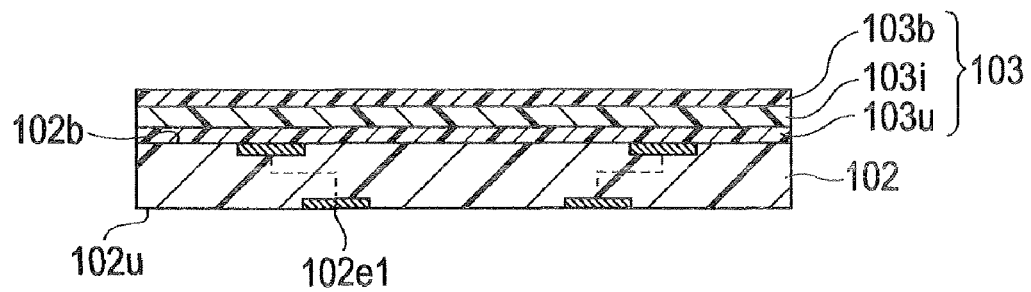
FIG. 7D is a cross-sectional view illustrating step D.
Figure 7E:
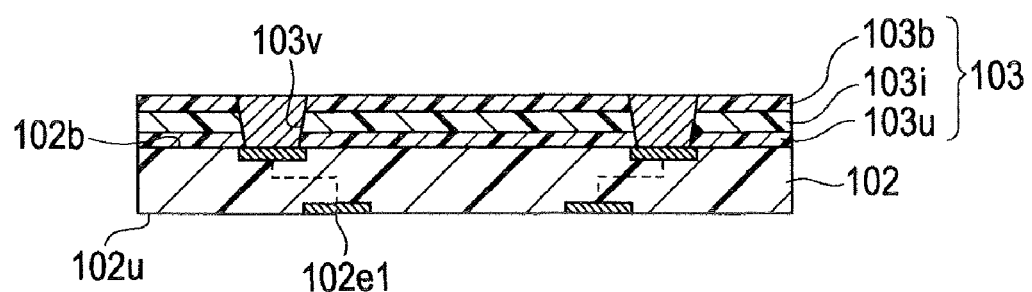
FIG. 7E is a cross-sectional view illustrating step E.
Figure 7F:
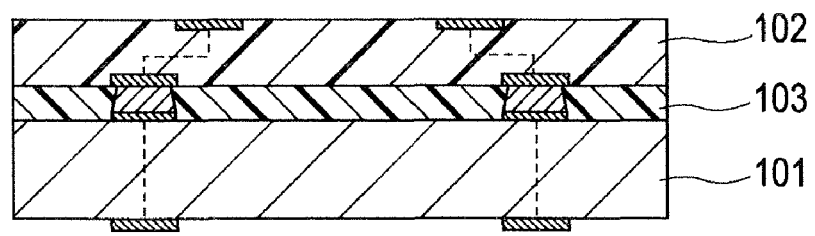
FIG. 7F is a cross-sectional view illustrating step F.

As illustrated in FIG. 7C, the resin layer 103 prepared in Step C includes the first sublayer 103*u*, the second sublayer 103*b*, and the third sublayer 103*i*. The resin layer 103 connects the base layer 101 to the interconnection layer 102. The first sublayer 103*u* and the second sublayer 103*b* have thermosetting properties and are each in a semi-cured (B stage) state. The third sublayer 103*i* has thermoplasticity and is in a solidified state. The term "solidified state" in the present embodiment refers to a state at the melting point or lower of the thermoplastic resin when the thermoplastic resin is crystallizable or a state at the glass transition temperature or lower of the thermoplastic resin when the thermoplastic resin is amorphous. The thermal expansion coefficient of the third sublayer 103*i* is lower than those of the first sublayer 103*u* and the second sublayer 103*b*. In the xy-direction (planar direction) of a virtual xyz space as illustrated in FIG. 7C, the third sublayer 103*i* has a thermal expansion coefficient lower than those of the first sublayer 103*u* and the second sublayer 103*b*. The sublayers are stacked in the z-direction.

Figure 9:
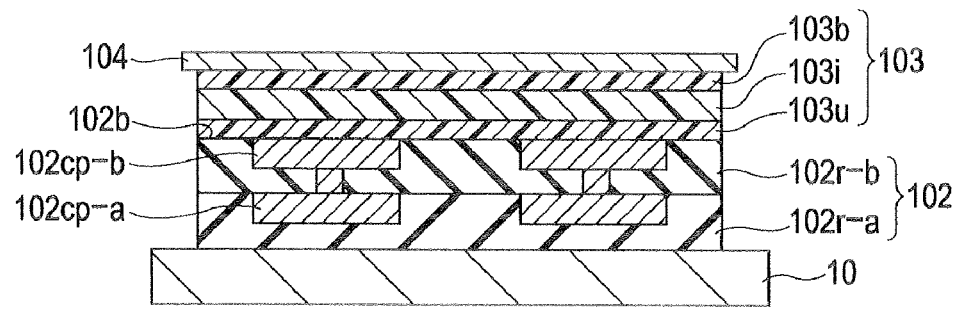
FIG. 9 is a cross-sectional view illustrating step D.

Step D will be described below. As illustrated in FIG. 9, the resin layer 103 is laminated on the second surface 102*b* of the interconnection layer 102. The second surface 102*b* of the interconnection layer 102 faces the first sublayer 103*u* of the resin layer 103. A film 104 is laminated on the resin layer 103. The film 104 is in contact with the second sublayer 103*b* of the resin layer 103. The resin layer 103 is attached to the second surface 102*b* of the interconnection layer 102 by a first thermal process at a first temperature. The first temperature is in the range of 80° C. to 180° C. The first sublayer 103*u* is in a semi-cured state during the first thermal process. The film 104 is attached to the second sublayer 103*b* of the resin layer 103 by the first thermal process. The second sublayer 103*b* is in a semi-cured state during the first thermal process. The third sublayer 103*i* is in a solid state during the first thermal process. The third sublayer 103*i* prevents deformation of the first and second sublayers 103*u* and 103*b* due to thermal expansion in the planar direction during the first thermal process.

Figure 10A:
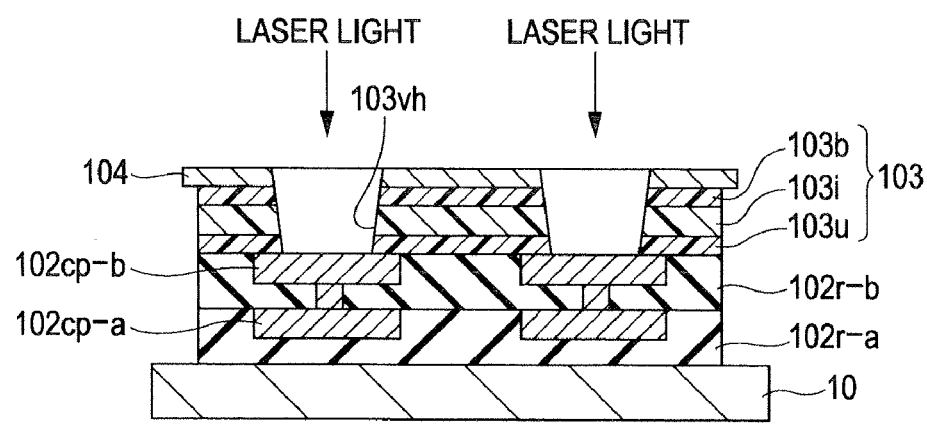
FIGS. 10A and 10B are cross-sectional views illustrating step E.
Figure 10B:
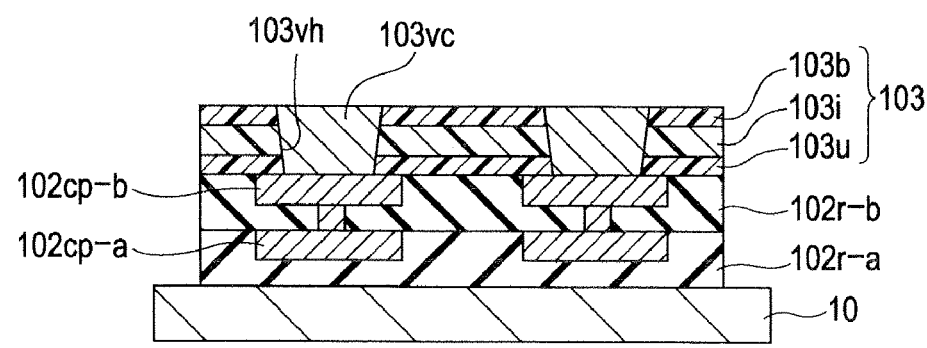

Step E will be described below. As illustrated in FIG. 10A, The film 104 and the resin layer 103 are irradiated with laser light to form a plurality of via holes 103*vh* in the resin layer 103. As illustrated in FIG. 10B, a conductive paste is applied to the via holes 103*vh* by printing to form via conductors 103*vc* in the resin layer 103. After formation of the via conductors 103*vc*, the film 104 is detached from the resin layer 103.

Figure 11A:
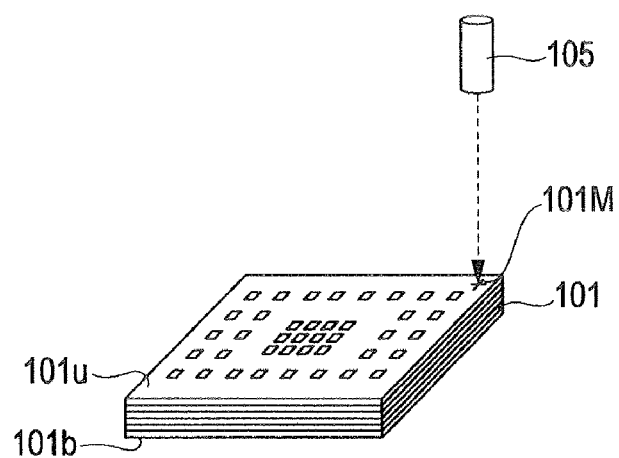
Figure 11B:
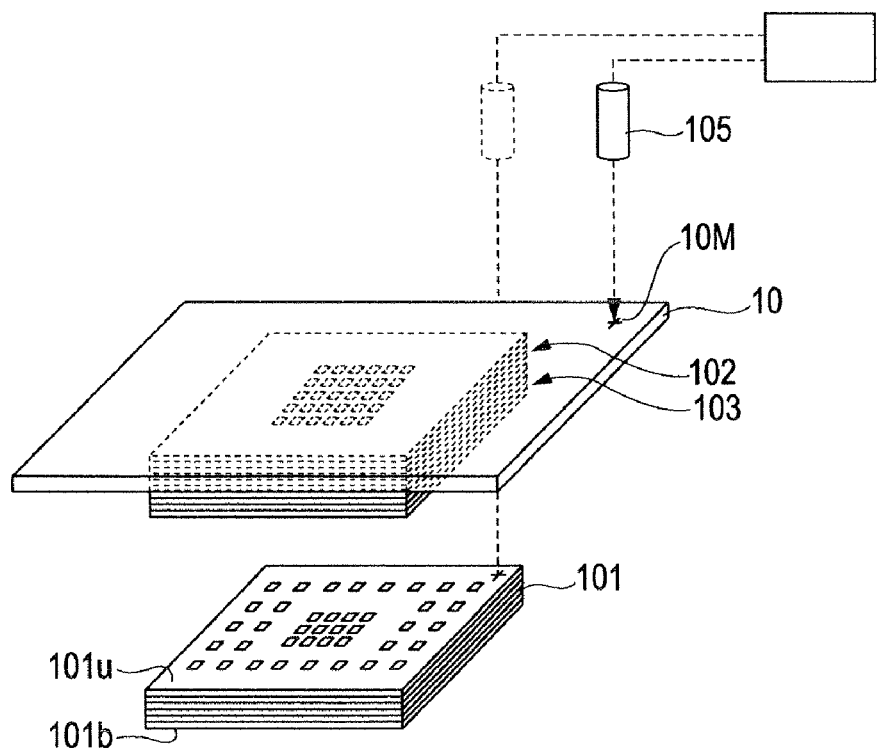

Step F will be described below. As illustrated in FIG. 11A, an alignment mark 101M formed on the first surface 101*u* of the base layer 101 is read by an image recognition apparatus 105. As illustrated in FIG. 11B, an alignment mark 10M formed on the plate 10 fixing the interconnection layer 102 is read by the image recognition apparatus 105. The base layer 101 and the plate 10 are aligned on the basis of the position data of the alignment marks 101M and 10M. The alignment mark 10M is formed on the plate 10 by sputtering with a metal material or by photolithography. The metal material constituting alignment mark 10M is titanium (Ti), copper (Cu), chromium (Cr), gold (Au), platinum (Pt), nickel (Ni), or aluminum (Al).

As illustrated in FIG. 12, the resin layer 103 is attached to the first surface 101*u* of the base layer 101 by a second thermal process at a second temperature. The second temperature is higher than the first temperature and is in the range of 180° C. to 300° C. The first and second sublayers 103*u* and 103*b* are completely cured (C-stage state) by the second thermal process. The third sublayer 103*i* prevents deformation of the first and second sublayers 103*u* and 103*b* due to thermal expansion in the planar direction during the second thermal process. The plate 10 is detached from the interconnection layer 102. In the case of the plate 10 made of a glass material or a silicon material, the plate 10 is removed from the interconnection layer 102 by etching. In the case of the plate 10 made of a ceramic material, the plate 10 is removed from the interconnection layer 102 by polishing.

A method of inspecting a semiconductor wafer with a substrate that can be obtained by the method of manufacturing the substrate according to this embodiment will be described below with reference to FIG. 13. As illustrated in FIG. 13, a process of manufacturing a semiconductor device includes Steps A2 to D2.

Step A2: Diffusion Step

Films are formed on a semiconductor wafer. A plurality of chips are formed on the semiconductor wafer.

Step B2: G/W Step (Inspection of Semiconductor Wafer)

Electrical characteristics of the plurality of chips formed on the semiconductor wafer are checked. The method of inspecting the semiconductor wafer includes the steps of placing the semiconductor wafer on a stage, electrically connecting a tester to a probe card assembly including a substrate having a interconnection layer attached to a base layer with a resin layer including a plurality of sublayers made of different materials, and bringing probes of the probe card assembly into electrical contact with electrodes of the semiconductor wafer. The inspection of the probe card assembly including the substrate obtained by the manufacturing method according to this embodiment improves reliability for multiple contacts of the probes.

Step C2: Assembling Step

The semiconductor wafer is diced into individual chips.

Step D2: Screening Step

Characteristics of the resulting semiconductor devices are checked.

What is claimed is:

1. A substrate for a probe card assembly, comprising:
an interconnection layer including a first surface having a plurality of first electrode sets and a second surface having a plurality of second electrode sets electrically connected to the plurality of first electrode sets;
a base layer including a first surface having a plurality of third electrode sets electrically connected to the plurality of second electrode sets and a second surface having a plurality of contact terminals electrically connected to the plurality of third electrode sets; and
a resin layer including a plurality of sublayers made of different materials, the resin layer being attached to the first surface of the base layer and the second surface of the interconnection layer,
wherein the resin layer includes a first sublayer, a second sublayer, and a third sublayer,
wherein a thermal expansion coefficient of the third sublayer is lower than a thermal expansion coefficient of the first sublayer and a thermal expansion coefficient of the second sublayer,
wherein the third sublayer is disposed between the first sublayer and the second sublayer,
wherein the first surface of the base layer is made of ceramic,
wherein the second surface of the interconnection layer is made of resin insulating material,
wherein the first sublayer is made of a first thermosetting resin material and attached to the second surface of the interconnection layer, and
wherein the second sublayer is made of a second thermosetting resin material different from the first thermosetting resin material and attached to the first surface of the base layer.

2. The substrate according to claim 1,
wherein the third sublayer is made of a thermoplastic resin material.

3. The substrate according to claim 2,
wherein the third sublayer is made of the resin material selected from a group consisting of glass epoxy resins, polyether ether ketone resins, and polyimide resins.

4. The substrate according to claim 3,
wherein the resin layer includes
the first sublayer made of a polyamide imide resin,
the second sublayer made of a polyimide resin, and
the third sublayer made of a polyether ether ketone resin.

5. The substrate according to claim 3,
wherein the resin layer includes
the first sublayer made of a polyimide resin,
the second sublayer made of an epoxy resin, and
the third sublayer made of a glass epoxy resin.

6. The substrate according to claim 3,
wherein the resin layer includes
the first sublayer made of a polyimide siloxane resin,
the second sublayer made of a fluorocarbon resin, and
the third sublayer made of a polyimide resin.

7. The substrate according to claim 1, wherein each second electrode set of the plurality of second electrode sets are provided on the second surface at a location offset from a location of a respective, electrically connected first electrode set of the plurality of first electrode sets on the first surface.

8. The substrate according to claim 1, wherein each third electrode set of the plurality of third electrode sets is electrically connected to a contact terminal of the plurality of contact terminals by a linear, vertically extending via conductor.

9. The substrate according to claim 1, wherein the distance between the first electrode sets is smaller than a distance between the second electrode sets.

10. The substrate according to claim 1, wherein the resin layer includes a plurality of via conductors that extend linearly and vertically from an upper surface of the resin layer to a lower surface of the resin layer.

11. The substrate according to claim 10, wherein each via conductor of the plurality of via conductors electrically connects each second electrode set of the plurality of second electrode sets to a respective third electrode set of the plurality of third electrode sets.

12. The substrate according to claim 1, wherein, in the third electrode sets, an area of an outer electrode provided in a peripheral region of the first surface of the base layer is larger than an area of an inner electrode provided in a central region of the first surface of the base layer.

13. The substrate according to claim 12,
wherein the resin layer includes a plurality of via conductors, and
wherein the number of the via conductors connected with the outer electrode provided in the peripheral region is larger than the number of the via conductors connected with the inner electrode provided in the central region.

14. The substrate according to claim 1, wherein a distance between the first electrode sets is smaller than a distance between the contact terminals.

* * * * *